(12) United States Patent
Misumi

(10) Patent No.: US 9,735,081 B2
(45) Date of Patent: Aug. 15, 2017

(54) SEMICONDUCTOR DEVICE

(71) Applicant: TOYOTA JIDOSHA KABUSHIKI KAISHA, Toyota-shi, Aichi-ken (JP)

(72) Inventor: Tadashi Misumi, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/309,615

(22) PCT Filed: May 8, 2015

(86) PCT No.: PCT/JP2015/063356
§ 371 (c)(1),
(2) Date: Nov. 8, 2016

(87) PCT Pub. No.: WO2016/006313
PCT Pub. Date: Jan. 14, 2016

(65) Prior Publication Data
US 2017/0154833 A1    Jun. 1, 2017

(30) Foreign Application Priority Data

Jul. 7, 2014   (JP) .................................. 2014-139703

(51) Int. Cl.
*H01L 29/06* (2006.01)
*H01L 23/34* (2006.01)
*H01L 29/739* (2006.01)
*H01L 29/10* (2006.01)
*H01L 29/861* (2006.01)
*H01L 27/06* (2006.01)

(52) U.S. Cl.
CPC .......... *H01L 23/34* (2013.01); *H01L 27/0664* (2013.01); *H01L 29/1095* (2013.01); *H01L 29/7397* (2013.01); *H01L 29/861* (2013.01)

(58) Field of Classification Search
CPC . H01L 23/34; H01L 29/7397; H01L 29/1095; H01L 29/861; H01L 27/0664
See application file for complete search history.

(56) References Cited

FOREIGN PATENT DOCUMENTS

JP          2005-116702 A     4/2005

*Primary Examiner* — Long Pham
(74) *Attorney, Agent, or Firm* — Oliff PLC

(57) ABSTRACT

A semiconductor device capable of carrying out temperature detection appropriately by a temperature sensor is provided. In a semiconductor device disclosed herein, a first width of a first portion within a front surface insulating film (that is, part located in an upper part of an active region among a part extending along a first side of a front surface electrode that is closer to the temperature sensor) is wider than a second width of a second portion within the front surface insulating film (that is, part located in the upper part of the active region among a part extending along a second side of the front surface electrode).

2 Claims, 7 Drawing Sheets

SEMICONDUCTOR DEVICE

TECHNICAL FIELD

This application claims priority to Japanese Patent Application No. 2014-139703 filed on Jul. 7, 2014, the entire contents of which are hereby incorporated by reference into the present application.

The present invention relates to a semiconductor device.

BACKGROUND ART

Japanese Patent Application Publication No. 2005-116702 discloses a semiconductor device in which a high-thermal conductor is bonded to a portion of a surface of a surface electrode of a semiconductor element disposed on a semiconductor substrate.

SUMMARY OF INVENTION

Technical Problem

In this type of semiconductor device, there may be a case where a configuration is employed in which the surface of the surface electrode that is near a periphery of the surface electrode is covered with an insulating film, and a high-thermal conductor is bonded to the surface of the surface electrode within an opening in which the insulating film is not disposed. Further, there may be a case where a configuration is employed in which a temperature sensor is disposed in another part than the semiconductor element of the semiconductor substrate. It is preferable that the temperature sensor detects a part that has a temperature as high as possible. In this case, the semiconductor element that is below the surface electrode located within a range to which the high-thermal conductor is not connected (i.e., surface electrode within the range where the insulating film is disposed) has difficulty in transferring heat generated by operation of the semiconductor element to the high-thermal conductor, as a result of which the semiconductor element may possibly be heated to a high temperature. In this case, a part a temperature of which is not detected by the temperature sensor may possibly become hotter than a part a temperature of which is detected, and thus the temperature detection may not be appropriately carried out.

The present specification discloses a semiconductor device capable of allowing a temperature sensor to carry out temperature detection appropriately.

Solution to Technical Problem

A semiconductor device disclosed herein comprises: a semiconductor substrate; a gate insulating film; a gate electrode; a front surface electrode; a temperature sensor; a front surface insulating film; and a thermal conductor. The semiconductor substrate comprises: a plurality of n-type first regions exposed on a front surface of the semiconductor substrate; a p-type body region in contact with the first regions and exposed on the front surface; and an n-type second region in contact with the body region and separated from the first regions by the body region. The gate insulating film is in contact with the body region. The semiconductor substrate comprises an active region overlapping with the first regions and a region positioned between the respective first regions, and a non-active region positioned outside of the active region in a plan view of the front surface. The front surface electrode is provided on the front surface in the active region and connected to the first regions and the body region. The temperature sensor is disposed above the front surface in the non-active region. The front surface insulating film is provided on the front surface in the non-active region and on the front surface electrode, and extends across from the non-active region to the active region, at least a part of the front surface insulating film above the front surface electrode comprising an aperture. The thermal conductor is connected to the front surface electrode inside the aperture. The front surface electrode comprises a first side positioned closer to the temperature sensor and a second side positioned on an opposite side to the first side in the plan view of the front surface electrode. The front surface insulating film on the front surface electrode within the active region comprises: a first portion extending along the first side and having a first width in a direction from the non-active region toward the active region; and a second portion extending along the second side and having a second width in the direction from the non-active region toward the active region. The first width is wider than the second width.

The body region includes a body contact region having a high p-type impurity concentration and a low concentration region having a low p-type impurity concentration. The body contact region is exposed on the front surface of the semiconductor substrate. The front surface electrode is connected to the body contact region. The low concentration region is disposed below the body contact region.

According to the above configuration, the first width of the first portion within the front surface insulating film (that is, a width of the front surface insulating film that is closer to the temperature sensor and located in the active region) is wider than the second width of the second portion within the front surface insulating film (that is, a width of the front surface insulating film that is on the side opposite to the temperature sensor and located in the active region). That is, the semiconductor substrate located below the first portion has greater difficulty in transferring the generated heat to the thermal conductor than the semiconductor substrate below the second portion does, and thus is highly likely to have a high temperature. Therefore, according to the above configuration, a part where the temperature sensor carries out the temperature detection is liable to have a higher temperature than a part where the temperature sensor does not carry out the temperature detection. Accordingly, the temperature sensor may appropriately carry out the temperature detection of the semiconductor device.

DESCRIPTION OF EMBODIMENTS

Some features of embodiments described hereinbelow will be listed. Notably, each of the below features is independently useful.

(Feature 1) The semiconductor substrate may comprise a p-type voltage resistant region provided in the non-active region and extending from the front surface to a position deeper than the body region. The body region may be provided between the voltage resistant region and the first regions. The front surface electrode may extend from the active region to a position in contact with a front surface of the voltage resistant region, and may be connected with the voltage resistant region. A portion of the front surface electrode that is provided within the non-active region may comprise: a third portion extending along the first side and having a third width in the direction from the non-active region toward the active region; and a fourth portion extending along the second side and having a fourth width in the direction from the non-active region toward the active region. The fourth width may be wider than the third width. A portion of the voltage resistant region that is provided below the front surface electrode may comprise: a fifth portion extending along the first side and having a fifth width in the direction from the non-active region toward the active region; and a sixth portion extending along the second side and having a sixth width in the direction from the non-active region toward the active region. The sixth width may be wider than the fifth width.

First Embodiment

Figure 1:
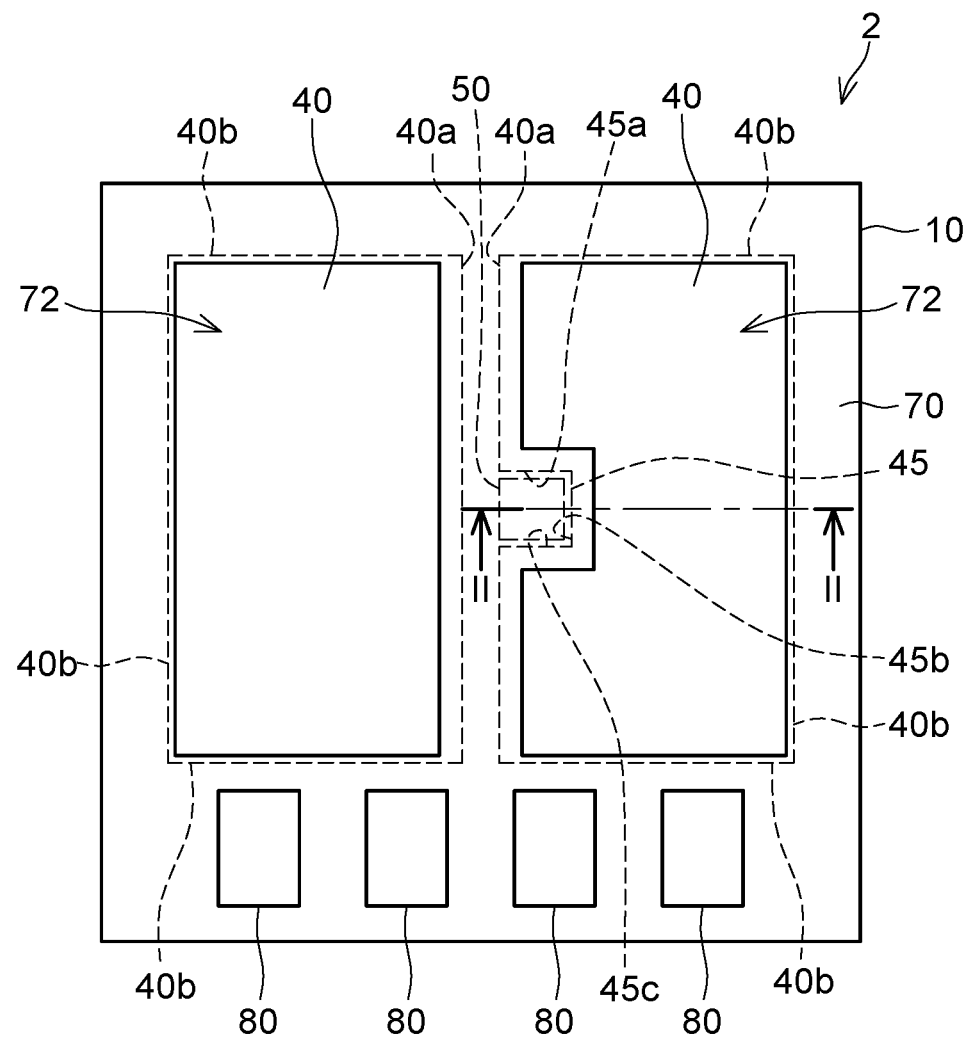
FIG. 1 is a plan view schematically showing a semiconductor device of a first embodiment.

A semiconductor device 2 in a first embodiment as shown in FIG. 1 comprises a semiconductor substrate 10, two front surface electrodes 40, a temperature sensor 50, a front surface insulating film 70, and four small signal pads 80. Notably, FIG. 1 omits to illustrate thermal conductors 60 (see FIG. 2) connected to the front surface electrodes 40.

The semiconductor substrate 10 is a substrate constituted of Si. The semiconductor substrate 10 includes an active region 100 and a non-active region 110 (see FIG. 2.), both of which will be described later. A detailed structure of the semiconductor substrate 10 will be described later.

The front surface electrodes 40 are connected to a front surface of the semiconductor substrate 10. The front surface electrodes 40 are constituted of laminated films of Al, Ti, Ni, and Au. Each surface electrode 40 has a first side 40a located closer to the temperature sensor 50 and second sides 40b other than the first side 40a. A concave 45 is formed in the first side 40a in the front surface electrode 40 on the right side in FIG. 1. Respective sides 45a, 45b, and 45c constituting the concave 45 are a part of the first side 40a.

The temperature sensor 50 is a diode capable of detecting a temperature semiconductor substrate 10. The temperature sensor 50 is provided on the semiconductor substrate 10 and between the two front surface electrodes 40. To put in detail, the temperature sensor 50 is arranged on the semiconductor substrate 10 and within the concave 45 in the front surface electrode 40 on the right side of FIG. 1.

The front surface insulating film 70 is constituted of polyimide. The front surface insulating film 70 is arranged on the semiconductor substrate 10, specifically, on a part of the front surface where the front surface electrodes 40 are not provided, on a front surface of the temperature sensor 50, and on a front surface of a peripheral portion of the front surface electrodes 40. In the front surfaces of the front surface electrodes 40, apertures 72 are formed at locations where the front surface insulating film 70 is not arranged. The front surface electrodes 40 are exposed inside of the apertures 72. A thermal conductor 60 (not shown) is bonded to the front surface of each of the exposed front surface electrodes 40.

Figure 2:
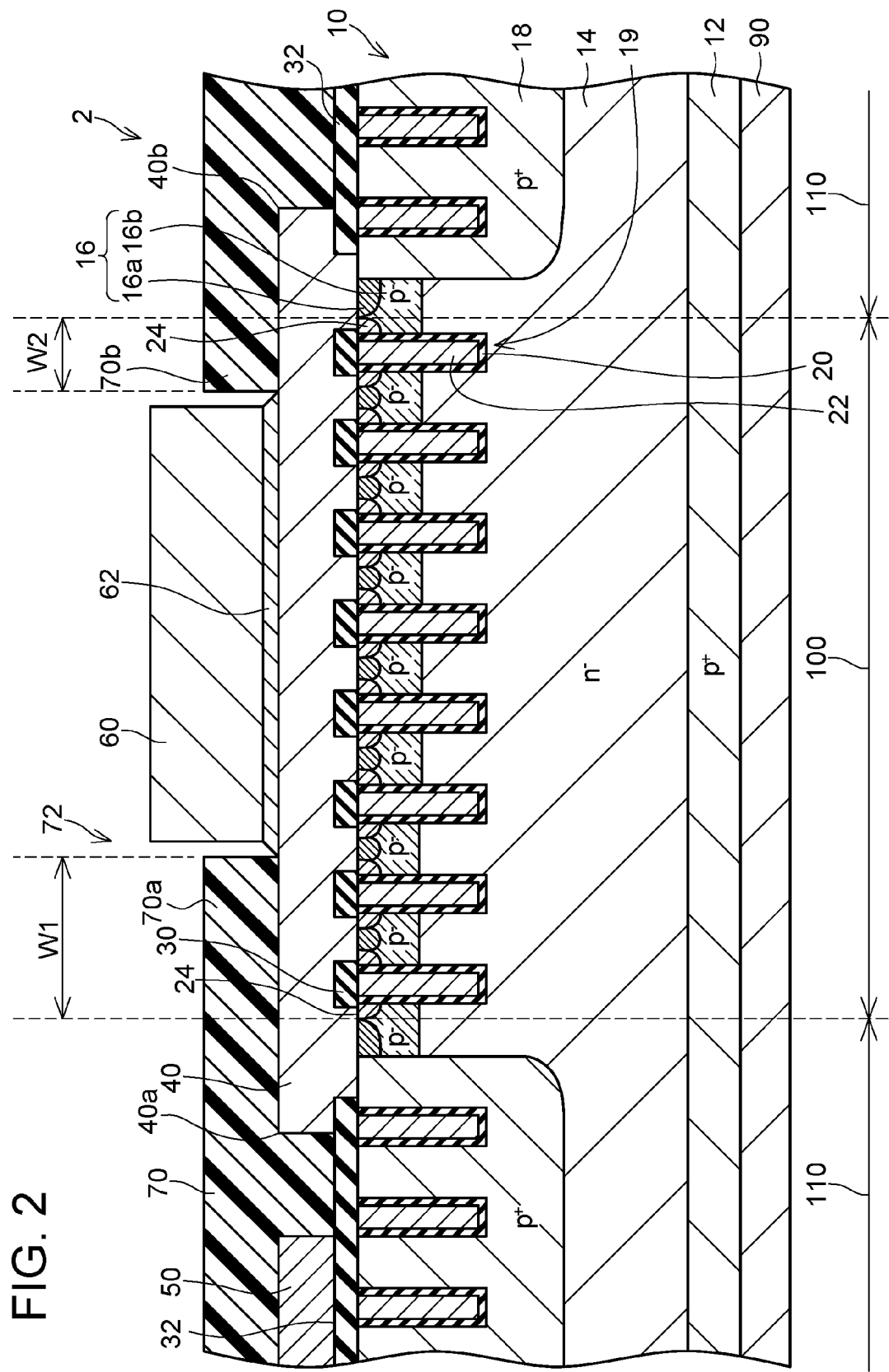
FIG. 2 is a cross sectional view of FIG. 1 along line II-II.

As shown in FIG. 2, the semiconductor substrate 10 comprises the active region 100 and the non-active region 110. In a plan view of the semiconductor substrate 10, the active region 100 includes ranges where emitter regions 24 (described later) are disposed, and ranges located between the respective emitter regions 24. In the plan view of the semiconductor substrate 10, the non-active region 110 is located outside of the active region 100. The non-active region 110 does not include the emitter regions 24.

A plurality of trenches 19 is disposed in the front surface of the semiconductor substrate 10 (upper surface in FIG. 2). A gate insulating film 20 is disposed on a wall surface of each trench 19. The gate insulating film 20 is a silicon oxide film. A gate electrode 22 is disposed in each trench 19.

The $n^+$ type emitter regions 24 are disposed in an area defining the front surface of the active region 100. Each emitter region 24 is provided to be in contact with the corresponding gate insulating film 20. Further, a $p^-$ type body region 16 is disposed in the area defining the front surface of the active region 100 and under the emitter regions 24. The body region 16 is in contact with the gate insulating films 20 under the emitter regions 24. The body region 16 is provided to extend to a position shallower than lower ends of the trenches 19. Notably, a part of the body region 16 is disposed also in the non-active region 110. The body region 16 includes body contact regions 16a located in the area defining the front surface of the semiconductor substrate 10, and a low concentration region 16b under the body contact regions 16a and the emitter regions 24. A p-type impurity concentration of the body contact regions 16a is higher than a p-type impurity concentration of the low concentration region 16b.

In an area defining a front surface of the non-active region 110, a p+ type FLR (abbreviation for Field Limiting Ring) region 18 is disposed. The FLR region 18 is arranged at a position apart from the emitter regions 24. The body region 16 (a body contact region 16a) is located between the FLR region 18 and the emitter regions 24. The FLR region 18 is provided to extend to a position deeper than the body region 16. More in detail, the FLR region 18 is provided to extend to a position deeper than lower ends of the gate electrodes 22.

An $n^-$ type drift region 14 is disposed under the body region 16 and the FLR region 18. The drift region 14 is separated from the emitter regions 24 by the body region 16. A $p^+$ type collector region 12 is disposed under the drift region 14 and in an area defining a back surface of the semiconductor substrate 10 (lower surface in FIG. 2). The collector region 12 is separated from the body region 16 by the drift region 14. In the active region 100, many IGBTs (abbreviation for Insulated Gate Bipolar Transistors) are formed by the emitter regions 24, the body region 16, the drift region 14, the collector region 12, and the gate electrodes 22.

A back surface electrode 90 is disposed on the back surface of the semiconductor substrate 10 over its entire area. The back surface electrode 90 makes ohmic contact with the collector region 12.

On the front surface of the semiconductor substrate 10, an insulating film 30 is provided on a front surface of each electrode 22 in the active region 100. Further, an insulating film 32 is provided on the front surface of the FLR region 18 in the non-active region 110. Notably, the insulating film 32 is not disposed on a part of the front surface of the FLR region 18 which is closer to the active region 100.

Further, the front surface electrodes 40 are provided on the front surface of the semiconductor substrate 10. The front surface electrodes 40 are provided so as to cover the respective insulating films 30 and a part of the insulating film 32. The front surface electrodes 40 are each in contact with the semiconductor substrate 10 in a range where no insulating films 30 and 32 are disposed, and make ohmic contact with the emitter regions 24, the body contact regions 16*a* (i.e., body region 16), and the FLR region 18. Moreover, the front surface electrodes 40 are insulated from the gate electrodes 22 in the active region 100 by the respective insulating films 30. The gate electrodes 22 in the active region 100 are connected to the small signal pads 80 (see FIG. 1). A side on the left in FIG. 2 is the first side 40*a* of the front surface electrode 40 (i.e., side closer to the temperature sensor 50), and a side on the right in FIG. 2 is one of the second sides 40*b* (i.e., sides on the opposite side to the temperature sensor 50). As shown in FIG. 2, the first side 40*a* is an upper end (i.e., edge) on the left side of the front surface electrode 40, and the second side 40*b* is an upper end (i.e., edge) on the right side of the front surface electrode 40.

The temperature sensor 50 is disposed on a front surface of the insulating film 32 on a first side 40*a* side of the front surface electrode 40.

The front surface insulating film 70 is disposed on the front surface of the temperature sensor 50, on the front surface of a part of the insulating film 32 where the front surface electrodes 40 are not provided, and on the front surface of the peripheral portion of the front surface electrodes 40. As shown in FIG. 2, the front surface insulating film 70 extends in an area ranging from the non-active region 110 across the active region 100. The apertures 72 are formed at locations where the front surface insulating film 70 is not arranged.

As shown in FIG. 2, the front surface insulating film 70 on each of the front surface electrodes 40 comprises a portion extending along the first side 40*a*, and this portion includes a first portion 70*a* located in an upper part of the active region 100, and the first portion 70*a* has a first width W1 in a direction from the non-active region 110 toward the active region 100. On the other hand, the front surface insulating film 70 on each front surface electrode 40 comprises a portion extending along the second sides 40*b*, and this portion includes a second portion 70*b* located in the upper part of the active region 100, and the second portion 70*b* has a second width W2 in the direction from the non-active region 110 toward the active region 100. As shown in FIG. 2, the first width W1 is wider than the second width W2.

The thermal conductor 60 is provided on the front surface of each front surface electrode 40 located in the aperture 72. The thermal conductor 60 has a higher thermal conductivity than thermal conductivities of the semiconductor substrate 10 and the front surface insulating film 70. It is preferable that the thermal conductivity of the thermal conductor 60 is equal to or more than 100 W/m·K. In the present embodiment, Cu is employed as the thermal conductors 60. The thermal conductor 60 is bonded via solder 62 to the front surface of each front surface electrode 40 in the aperture 72.

Next, operation of the semiconductor device 2 in the present embodiment will be described. The semiconductor device 2 in the present embodiment is used such that the front surface electrodes 40 are connected to a ground potential via an unillustrated external device (e.g., a motor) and the back surface electrode 90 is connected to a power source potential. Upon application of a voltage to the semiconductor device 2, in the IGBTs formed in the active region 100, an emitter side (front surface electrodes 40) comes to have a lower potential, and a collector side (back surface electrode 90) comes to have a higher potential. When a positive potential (voltage between gate and emitter) is applied to the gate electrodes 22 under this state, the body region 16 (i.e., low concentration region 16*b*) inverts from p-type to n-type in a range being in contact with the gate insulating films 20, thereby forming channels. Upon formation of the channels, electrons flow from the front surface electrodes 40 through the emitter regions 24, the channels in the body region 16, the drift region 14, and the collector region 12 to the back surface electrode 90. Further, holes flow from the back surface electrode 90 through the collector region 12 into the drift region 14. Thereupon, a conductivity modulation phenomenon occurs in the drift region 14, lowering an electrical resistance of the drift region 14 greatly. That is, the IGBTs are turned on. That is, a collector current flows in the IGBTs. When the application of the potential to the gate electrodes 22 is stopped, the channels disappear and the IGBTs are turned off. That is, the collector current flowing in the IGBTs is reduced and disappears. The holes that had flown into the drift region 14 passes through the body region 16 (the low concentration region 16*b* and the body contact regions 16*a*) to the front surface electrodes 40. Also, a part of the holes passes through the FLR region 18 to the front surface electrodes 40.

In the present embodiment, as shown in FIG. 2, the first width W1 of the first portion 70*a* of the front surface insulating film 70 (that is, the part located in the upper part of the active region 100 among the part extending along the first side 40*a* of each front surface electrode 40 that is closer to the temperature sensor 50) is wider than the second width W2 of the second portion 70*b* of the front surface insulating film 70 (that is, the part located in the upper part of the active region 100 among the part extending along the second sides 40*b* of each front surface electrode 40). Therefore, when the IGBTs are turned on, the generated heat is not so easily transferred to the thermal conductor 60 in the active region 100 below the first portions 70*a* than in the active region 100 below the second portions 70*b*. Therefore, the active region 100 below the first portions 70*a* will have a higher temperature than the active region 100 below the second portions 70*b*. That is, the first portions 70*a* closer to the temperature sensor 50 will have a higher temperature than the second portions 70*b* far from the temperature sensor 50. Therefore, the temperature sensor 50 can detect the temperature of a portion which has a higher temperature than other parts in the semiconductor substrate 10. Therefore, based on the detected value of the temperature sensor 50, the semiconductor substrate 2 can be suitably controlled so as to have a maximum temperature therein not exceed a standard value.

Further, by reducing the width of the second portions 70*b* which are far from the temperature sensor 50, a heat dissipation performance of the semiconductor device 2 can be improved.

Second Embodiment

Figure 3:
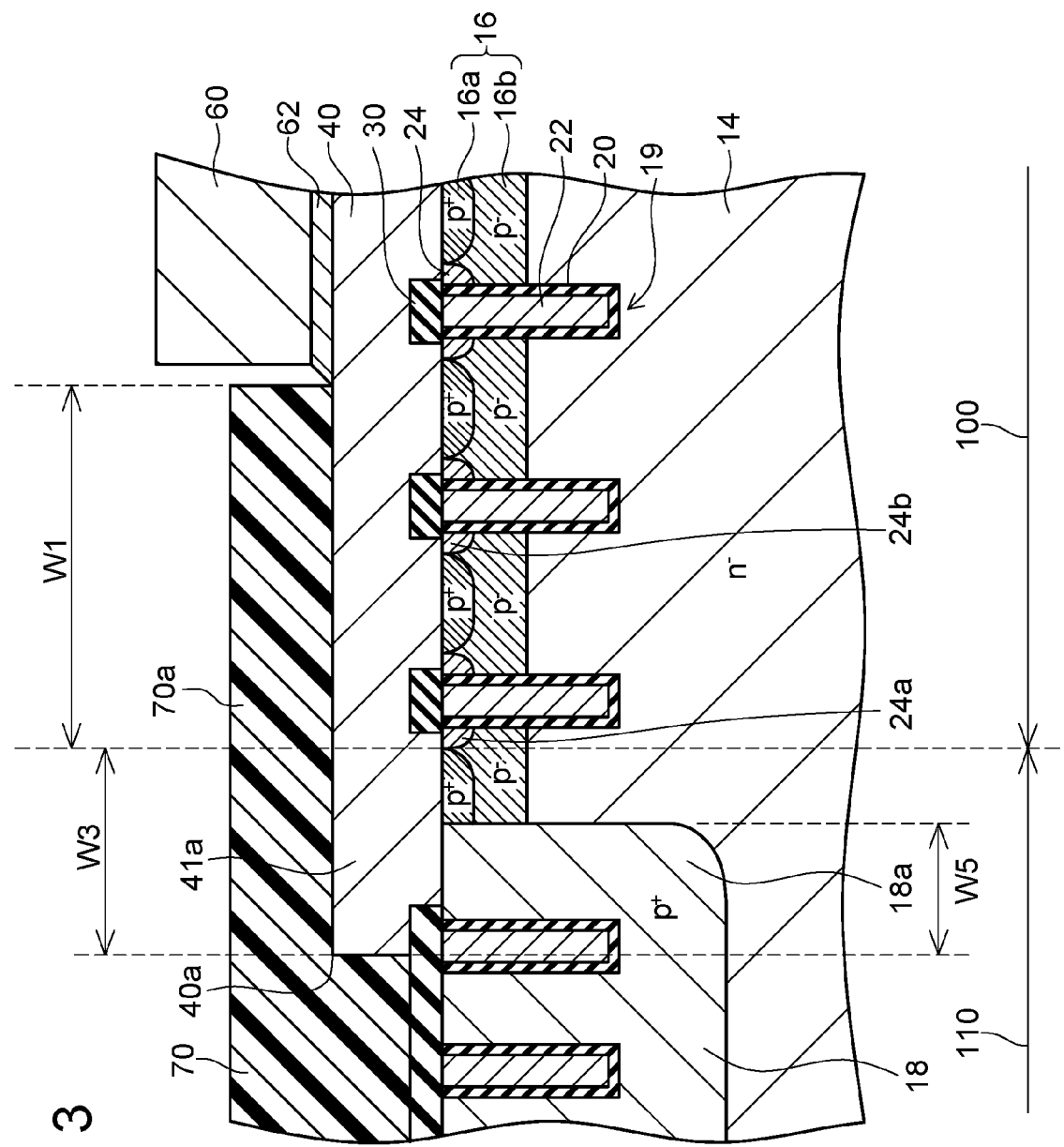
FIG. 3 is a cross sectional view (1) schematically showing a semiconductor device of a second embodiment.
Figure 4:
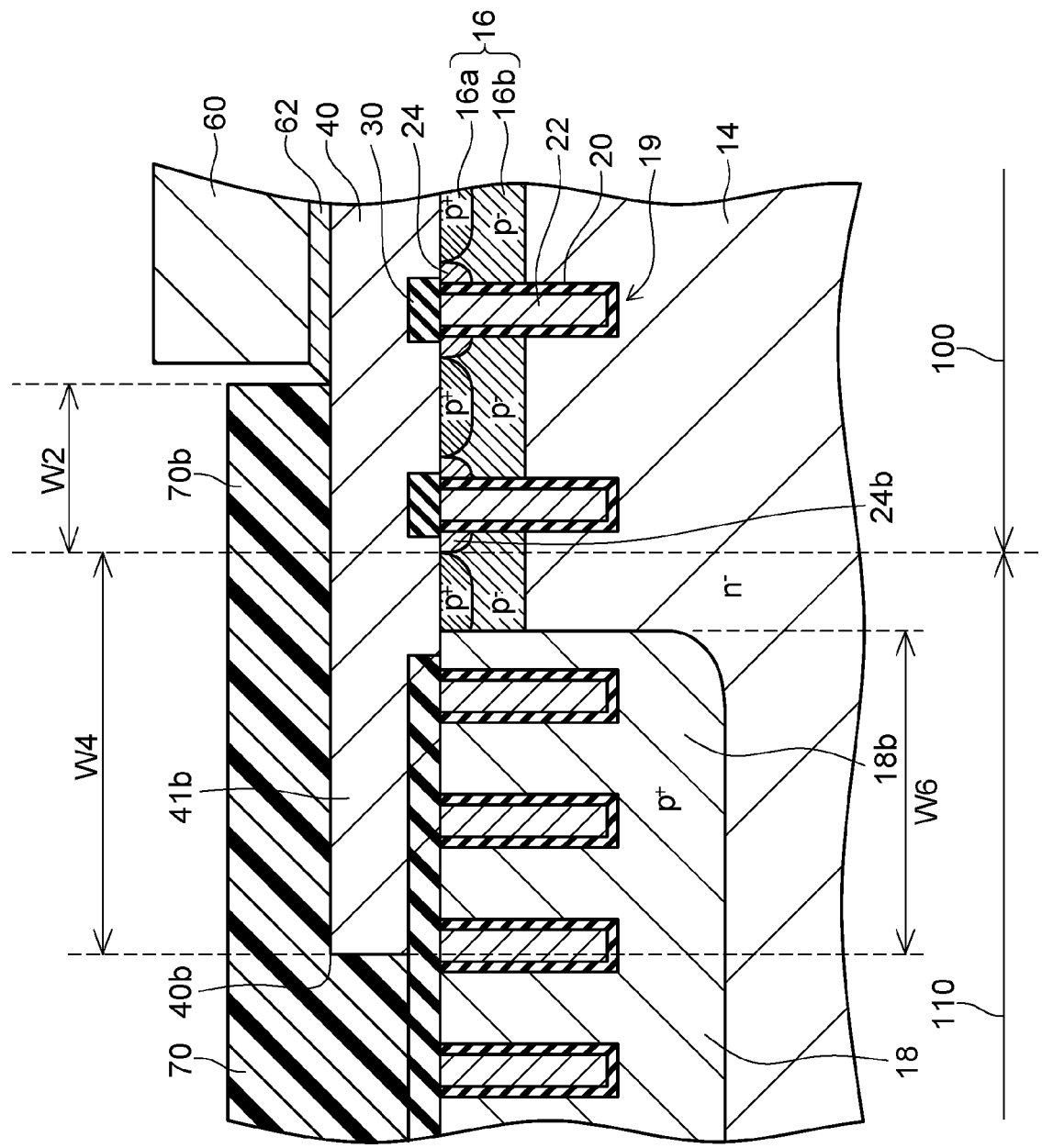
FIG. 4 is a cross sectional view (2) schematically showing the semiconductor device of the second embodiment.

As shown in FIGS. 3 and 4, also in the second embodiment, the second width W2 of the second portions 70*b* in the front surface insulating film 70 is narrower than the first width W1 of the first portions 70*a*, similar to the first embodiment.

In the second embodiment, a width W4 of each front surface electrode 40 which extends along the second sides 40*b* in the non-active region 110 (that is, width of a fourth portion 41*b*) is wider than a width W3 of the front surface electrode 40 which extends along the first side 40*a* in the non-active region 110 (that is, width of a third portion 41*a*).

Further, in the second embodiment, a width W6 of the FLR region 18 which is below the front surface electrode 40 and extends along the second sides 40b (that is, width of a sixth portion 18b) is wider than a width W5 of the FLR region 18 which is below the front surface electrode 40 and extends along the first side 40a (that is, width of a fifth portion 18a). Notably, each of the widths W3 to W6 is a dimension based on the direction from the active region 100 toward the non-active region 110.

Thus, the width W3 and the width W4 of the front surface electrode 40 in the non-active region 110 may differ from each other, in addition to the difference between the first width W1 and the second width W2. In this case, by setting the widths W5 and W6 of the FLR region 18 located below the front surface electrode 40 as described above, variation according to positions in distance between the emitter regions 24 and the FLR region 18 can be reduced. In more detail, the variation can be approximately equal between positions. In the examples of FIGS. 3 and 4, the distance between an emitter region 24a and the fifth portion 18a (FIG. 3) and the distance between an emitter region 24b and the sixth portion 18b (FIG. 4) can be approximately equal to each other.

If there are variations in distance between the FLR region 18 and the emitter regions 24 when the structures of FIGS. 3 and 4 are employed, there may be a case where it becomes difficult for holes to pass through a position having a large distance between the FLR region 18 and the emitter regions 24 upon turning off the IGBTs, as a result of which a breakdown resistance of the semiconductor device 2 at the turn-off may possibly be lowered. In this regard, in the present embodiment, the fourth width W4 of the fourth portion 41b of each front surface electrode 40 (that is, part on the non-active region 110 among the part extending along the second sides 40b; see FIG. 4) is wider than the third width W3 of the third portion 41a of the front surface electrode 40 (that is, part on the non-active region 110 among the part extending along the first side 40a; see FIG. 3), and the sixth width W6 of the sixth portion 18b of the FLR region 18 (that is, part extending along the second sides 40b among the part located below each front surface electrode 40; see FIG. 4) is wider than the filth width W5 of the fifth portion 18a of the FLR region 18 (that is, part extending along the first side 40a among the part below each front surface electrode 40). Therefore, a difference between a distance between the fifth portion 18a of the FLR region 18 and the active region 100 (see FIG. 3) and a distance between the sixth portion 18b of the FLR region 18 and the active region 100 (see FIG. 4) becomes small. In more detail, the respective distances can be made approximately equal to each other. Therefore, variations in hole passability at IGBT turnoff can be made small. Accordingly, the semiconductor device 2 can be suppressed from having the breakdown resistance deteriorated.

Third Embodiment

Figure 5:
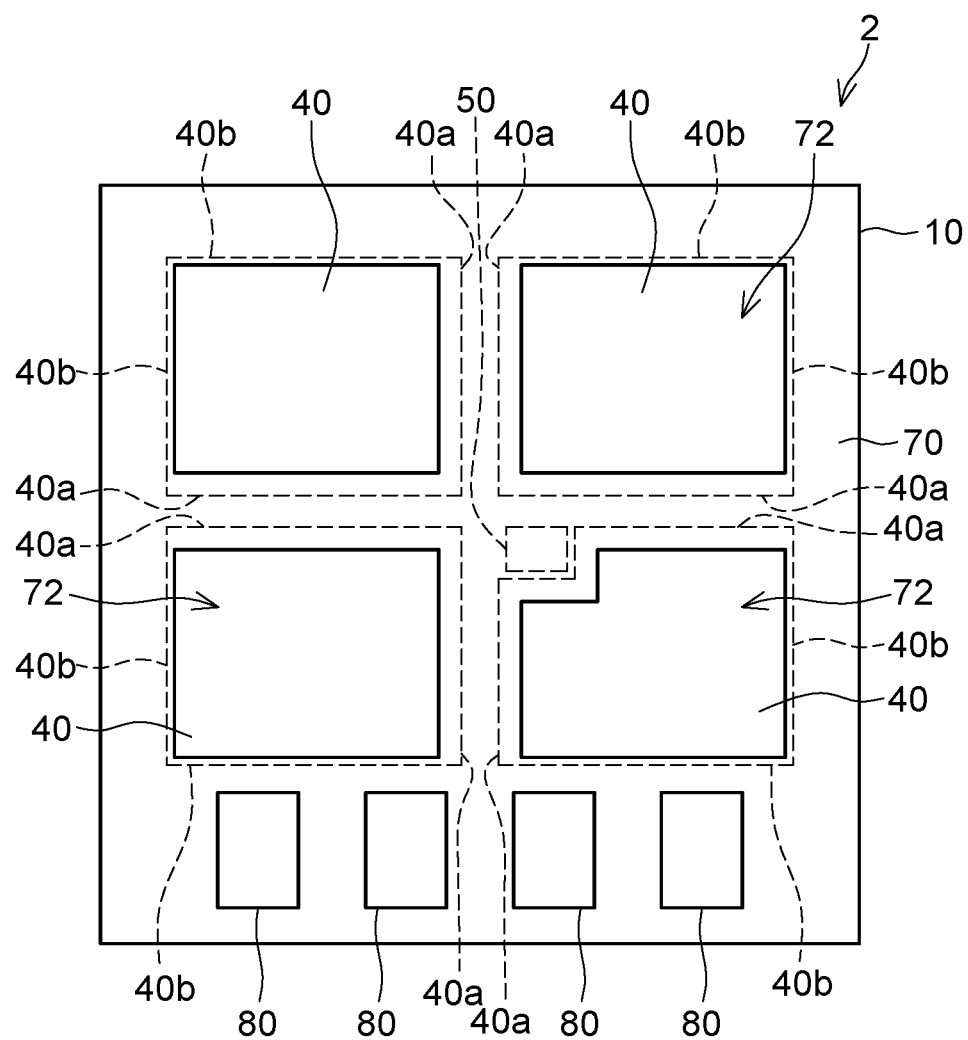
FIG. 5 is a plan view schematically showing a semiconductor device of a third embodiment.

In a semiconductor device 2 according to the third embodiment, differences from the first and second embodiments will be described. As shown in FIG. 5, the present embodiment is different from the first and second embodiments in that four front surface electrodes 40 are arranged on the semiconductor substrate 10. Each front surface electrode 40 has two sides closer to the temperature sensor 50 which are first sides 40a and the rest two sides that are second sides 40b. In the present embodiment also, in the front surface insulating film 70, a width of a portion that extends along the first sides 40a of each front surface electrode 40 is wider than a width of a portion that extends along the second sides 40b of the front surface electrodes 40. A cross sectional structure in proximity of the first sides 40a and a cross sectional structure in proximity of the second sides 40b are similar to those of the first and second embodiments (see FIGS. 2, 3, and 4).

Fourth Embodiment

Figure 6:
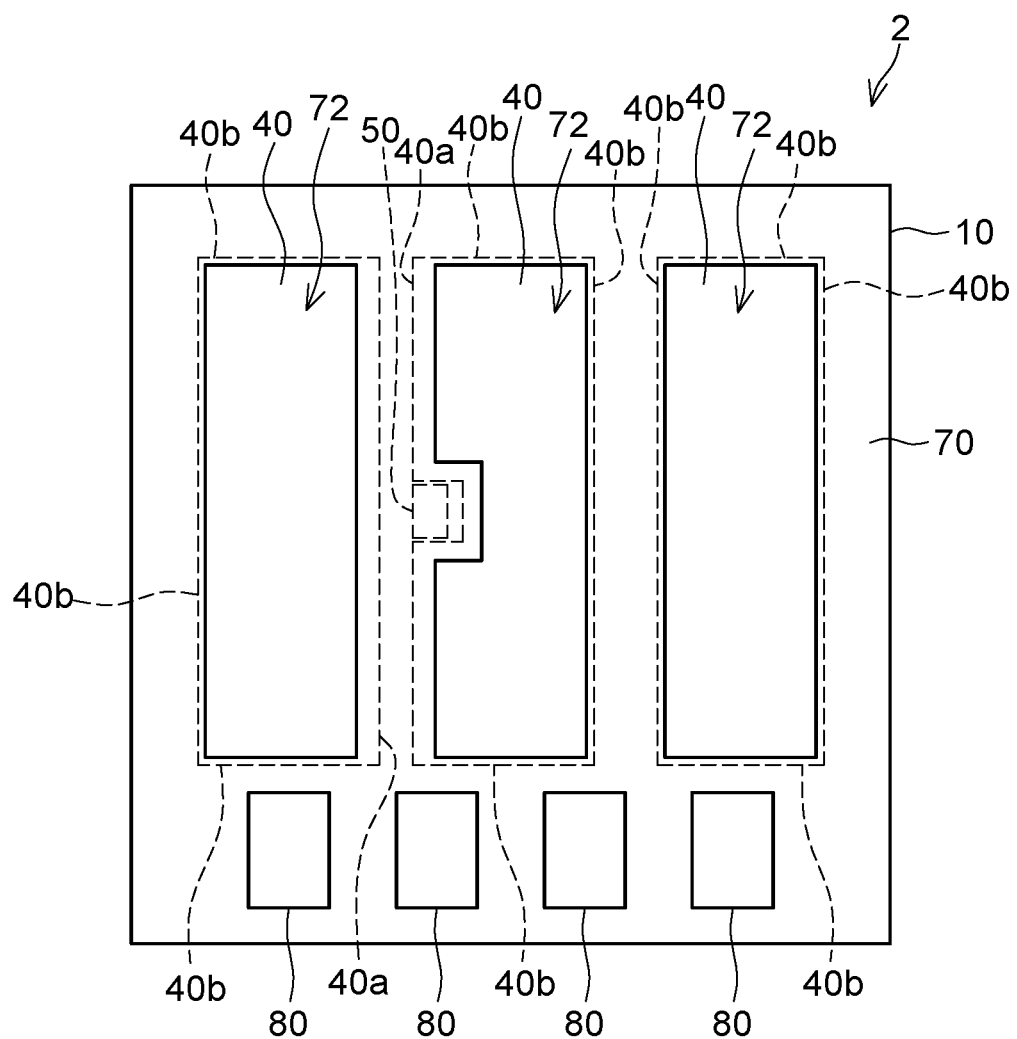
FIG. 6 is a plan view schematically showing a semiconductor device of a fourth embodiment.

As to a semiconductor device 2 according to the fourth embodiment, differences from the first and second embodiments will be described. As shown in FIG. 6, the present embodiment is different from the first and second embodiments in that three front surface electrodes 40 are arranged on the semiconductor substrate 10. The temperature sensor 50 is provided between two of the front surface electrodes 40 (two front surface electrodes 40 on the left side in FIG. 6). Of the two front surface electrodes 40, sides closer to the temperature sensor 50 are the first sides 40a and the rest of sides are the second sides 40b. Further, each side of one front surface electrode 40 in a vicinity of which the temperature sensor 50 is not arranged (front surface electrode 40 on the rightmost end of FIG. 6) is the second side 40b. In the present embodiment also, in the front surface insulating film 70, a width of the portion that extends along the first sides 40a of the front surface electrodes 40 is wider than a width of the portion that extends along the second sides 40b of the front surface electrodes 40. A cross sectional structure in proximity of the first sides 40a and a cross sectional structure in proximity of the second sides 40b are similar to those of the first and second embodiments (see FIGS. 2, 3, and 4).

Fifth Embodiment

Figure 7:
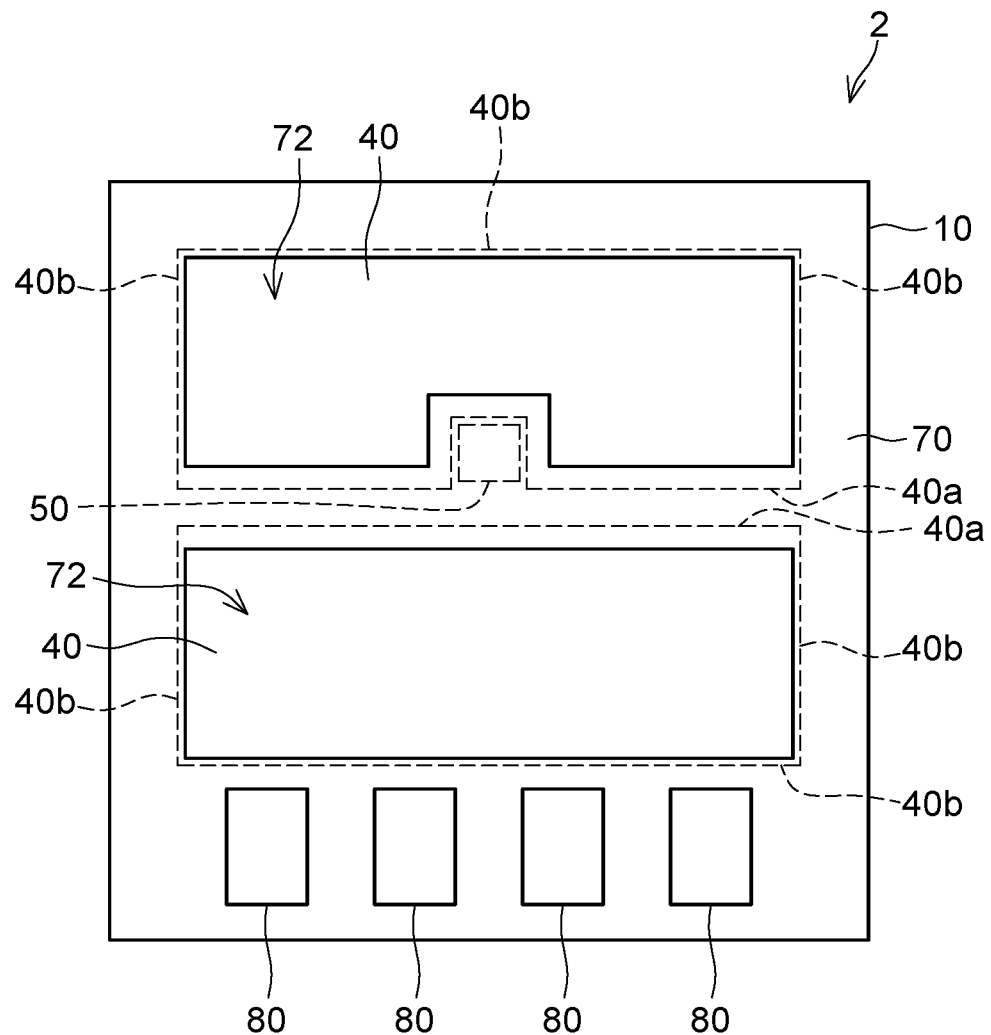
FIG. 7 is a plan view schematically showing a semiconductor device of a fifth embodiment.

As to a semiconductor device 2 according to the fifth embodiment, differences from the first and second embodiments will be described. As shown in FIG. 7, the present embodiment is different from the first and second embodiments in an arranging direction of two front surface electrodes 40 disposed on the semiconductor substrate 10. In the present embodiment also, each front surface electrode 40 has a first side 40a closer to the temperature sensor 50 and second sides 40h other than the first side 40a. In the present embodiment also, in the front surface insulating film 70, a width of the portion extending along the first sides 40a of the front surface electrodes 40 is wider than a width of the portion extending along the second sides 40b of the front surface electrodes 40. A cross sectional structure in proximity of the first sides 40a and a cross sectional structure in proximity of the second sides 40b are similar to those of the first and second embodiments (see FIGS. 2, 3, and 4).

Specific examples of the art disclosed herein have been described in detail, however, these are mere exemplary indications and thus do not limit the scope of the claims. The art described in the claims include modifications and variations of the specific examples presented above. For example, the following modifications may be implemented.

(Variant 1) In the semiconductor substrate 10, not being limited to the IGBT, another type of power semiconductor element that comprises an insulated gate electrode such as MOSFET etc. may be incorporated. Further, the semiconductor substrate 10 may not be limited to one made of Si material, but may be made of SiC material or GaN material.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
a semiconductor substrate; a gate insulating film; a gate electrode; a front surface electrode; a temperature sensor; a front surface insulating film; and a thermal conductor,
wherein
the semiconductor substrate comprises:
a plurality of n-type first regions exposed on a front surface of the semiconductor substrate;
a p-type body region in contact with the first regions and exposed on the front surface; and
an n-type second region in contact with the body region and separated from the first regions by the body region,
the gate insulating film is in contact with the body region,
the gate electrode faces the body region positioned between the first regions and the second region via the gate insulating film,
the semiconductor substrate comprises an active region overlapping with the first regions and a region positioned between the respective first regions, and a non-active region positioned outside of the active region in a plan view of the front surface,
the front surface electrode is provided on the front surface in the active region and connected to the first regions and the body region,
the temperature sensor is disposed above the front surface in the non-active region,
the front surface insulating film is provided on the front surface in the non-active region and on the front surface electrode, and extends from the non-active region into the active region, at least a part of the front surface insulating film above the front surface electrode comprising an aperture,
the thermal conductor is connected to the front surface electrode inside the aperture,
the front surface electrode comprises a first side positioned closer to the temperature sensor and a second side positioned on an opposite side to the first side in the plan view of the front surface electrode,
the front surface insulating film on the front surface electrode within the active region comprises:
a first portion extending along the first side and having a first width in a direction from the non-active region toward the active region; and
a second portion extending along the second side and having a second width in the direction from the non-active region toward the active region, and
the first width is wider than the second width.

2. The semiconductor device as in claim 1, wherein
the semiconductor substrate comprises a p-type voltage resistant region provided in the non-active region and extending from the front surface to a position deeper than the body region,
the body region is provided between the voltage resistant region and the first regions,
the front surface electrode extends from the active region to a position in contact with a front surface of the voltage resistant region, and is connected with the voltage resistant region,
a portion of the front surface electrode that is provided within the non-active region comprises:
a third portion extending along the first side and having a third width in the direction from the non-active region toward the active region; and
a fourth portion extending along the second side and having a fourth width in the direction from the non-active region toward the active region,
the fourth width is wider than the third width,
a portion of the voltage resistant region that is provided below the front surface electrode comprises:
a fifth portion extending along the first side and having a fifth width in the direction from the non-active region toward the active region; and
a sixth portion extending along the second side and having a sixth width in the direction from the non-active region toward the active region, and the sixth width is wider than the fifth width.

* * * * *